(12) United States Patent
Yamasaki et al.

(10) Patent No.: US 9,257,278 B2
(45) Date of Patent: Feb. 9, 2016

(54) METHOD FOR FORMING TiN AND STORAGE MEDIUM

(71) Applicant: TOKYO ELECTRON LIMITED, Tokyo (JP)

(72) Inventors: Hideaki Yamasaki, Yamanashi (JP); Takeshi Yamamoto, Yamanashi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 14/370,732

(22) PCT Filed: Dec. 12, 2012

(86) PCT No.: PCT/JP2012/082213
§ 371 (c)(1),
(2) Date: Jul. 3, 2014

(87) PCT Pub. No.: WO2013/103076
PCT Pub. Date: Jul. 11, 2013

(65) Prior Publication Data
US 2015/0004803 A1    Jan. 1, 2015

(30) Foreign Application Priority Data
Jan. 5, 2012  (JP) .................... 2012-000444

(51) Int. Cl.
*H01L 21/31*   (2006.01)
*H01L 21/033*  (2006.01)
(Continued)

(52) U.S. Cl.
CPC ............ *H01L 21/0332* (2013.01); *C23C 16/34* (2013.01); *C23C 16/56* (2013.01); *H01L 21/02274* (2013.01)

(58) Field of Classification Search
CPC .......... H01L 2224/16227; H01L 2224/81192; H01L 23/49827; H01L 24/03; H01L 24/81
USPC ..................... 438/776, 775; 216/41
See application file for complete search history.

(56) References Cited

U.S. PATENT DOCUMENTS 5,956,616 A * 9/1999 Mizuno et al. ............... 438/680
5,989,999 A   11/1999 Levine et al.
(Continued)

FOREIGN PATENT DOCUMENTS

GB    2306777 A    7/1997
JP    6-188205     7/1994
(Continued)

OTHER PUBLICATIONS

International Search Report; International Application No. PCT/JP2012/082213; Feb. 12, 2013.
(Continued)

*Primary Examiner* — Andy Huynh

(57) ABSTRACT

When forming a TiN film to be formed as a metallic hard mask for etching a film formed on a substrate to be processed, a first step and a second step are repeated a plurality of times to form a TiN film having reduced film stress. In the first step (step 1), the substrate to be processed is conveyed into a processing chamber, $TiCl_4$ gas and a nitriding gas are fed into the processing chamber, the interior of which being kept in a depressurized state during this time, and a plasma from the gases is generated to form a TiN unit film. In the second step (step 2), a nitriding gas is fed into the processing container, a plasma of the gas is generated, and the TiN unit film is subjected to plasma nitriding.

9 Claims, 11 Drawing Sheets

(51) Int. Cl.
  *C23C 16/34* (2006.01)
  *C23C 16/56* (2006.01)
  *H01L 21/02* (2006.01)

(56) References Cited

U.S. PATENT DOCUMENTS

| | | | |
|---|---|---|---|
| 6,040,021 A * | 3/2000 | Miyamoto | 427/576 |
| 6,155,198 A | 12/2000 | Danek et al. | |
| 6,251,758 B1 | 6/2001 | Chern et al. | |
| 6,555,183 B2 * | 4/2003 | Wang et al. | 427/535 |
| 2001/0025205 A1 | 9/2001 | Chern et al. | |
| 2004/0235191 A1 | 11/2004 | Hasegawa | |
| 2005/0112876 A1 * | 5/2005 | Wu et al. | 438/685 |
| 2006/0128108 A1 | 6/2006 | Kim et al. | |
| 2010/0297846 A1 | 11/2010 | Kaga et al. | |
| 2011/0086184 A1 * | 4/2011 | Okabe | 427/576 |
| 2014/0273470 A1 * | 9/2014 | Lin et al. | 438/702 |

FOREIGN PATENT DOCUMENTS

| | | |
|---|---|---|
| JP | 9-172083 A | 6/1997 |
| JP | 10-125626 | 5/1998 |
| JP | 2003-077864 | 3/2003 |
| JP | 2006-161163 | 6/2006 |
| JP | 2011-006783 | 1/2011 |
| JP | 2011-103330 | 5/2011 |

OTHER PUBLICATIONS

Abstract for TW201110234 (A), corresponding to JP2011006783; http://worldwide.espacenet.com/; Mar. 16, 2011.

Abstract for JP 2006-161163; http://worldwide.espacenet.com; Jun. 22, 2006.

Abstract for JPH09172083; http://worldwide.espacenet.com/; Jun. 30, 1997.

Abstract for JPH10125626 (A); http://worldwide.espacenet.com/; May 15, 1998.

Abstract for JP 2011-103330; http://worldwide.espacenet.com; May 26, 2011.

Abstract for JP 2003-077864; http://www.19.ipd.inpit.go.jp; Mar. 14, 2003.

Abstract for JP 06-188205; http://www.19.ipd.inpit.go.jp; Jul. 8, 1994.

* cited by examiner

METHOD FOR FORMING TIN AND STORAGE MEDIUM

FIELD OF THE INVENTION

The present invention relates to a method for forming a TIN film and a storage medium storing a program for executing such a method.

BACKGROUND OF THE INVENTION

Recently, a low dielectric film (low-k film) is used as an interlayer insulating film in order to decrease an inter-wiring capacitance in accordance with a demand for a high speed of semiconductor devices or the like. Since a low-k film having a lower k value is desired, a porous low-k film is used as the low-k film. This makes etching difficult during formation of BEOL (Back End Of Line) wiring.

Therefore, when the low-k film is used for the etching target film, a hard TiN film having a high etching resistance is used for a metallic hard mask as an etching mask in order to reduce damages to the low-k film during etching or ashing and improve an etching accuracy.

Currently, a PVD (Physical Vapor Deposition) method is widely used as a method for forming a TiN film for a metallic hard mask. However, a CVD (Chemical Vapor Deposition) method using $TiCl_4$ gas as a Ti-containing gas and a nitriding gas which is widely used as a method for forming a TiN film (see, e.g., Patent Document 1), an SFD (Sequential Flow Deposition) method for alternately repeating TiN film formation using $TiCl_4$ gas and nitriding using a nitriding gas, or an ALD (Atomic Layer Deposition) method for alternately supplying $TiCl_4$ gas and a nitriding gas (see, e.g., Patent Document 2) is also examined as a method for forming a TiN film for a metallic hard mask.

Patent Document 1: Japanese Patent Application Publication No. H06-188205

Patent Document 2: Japanese Patent Application Publication No. 2003-077864

However, as the porosity of the low-k film is increased to further reduce the k value, a mechanical strength of the low-k film is further reduced. Even if a TiN film is used as a metallic hard mask, a groove pattern is deformed after the etching of the metallic hard mask or the low-k film.

SUMMARY OF THE INVENTION

In view of the above, the present invention provides a method for forming a TiN film for a metallic hard mask which can suppress deformation of a groove pattern even when an etching target film is a low-k film having a low mechanical strength. The present invention also provides a storage medium storing a program for executing such a method.

In accordance with a first aspect of the present invention, there is provided a method of forming a TiN film to be used as a metallic hard mask in etching of an etching target film formed on a substrate to be processed, the method including: alternately repeating a step of forming a TiN unit film and a step of performing a plasma nitriding process on the TiN unit film to form a TiN film having a reduced film stress, wherein the step of forming the TiN unit film is performed by loading the substrate to be processed into a processing chamber, supplying $TiCl_4$ gas and a nitriding gas into the processing chamber while maintaining an inside of the processing chamber in a depressurized state, and generating a plasma from the $TiCl_4$ gas and the nitriding gas, and wherein the step of performing the plasma nitriding process is performed by supplying a nitriding gas into the processing chamber and generating a plasma from the nitriding gas.

The TiN film having the reduced stress may be formed by reducing a tensile stress of the TiN unit film formed in the step of forming the TiN unit film during the step of performing the plasma nitriding process.

The number of repeating the step of forming the TiN unit film and the step of performing the plasma nitriding process may be set in accordance with a film thickness of the TiN film to be formed. The film thickness of the TiN film may be 10 to 40 nm, and the number of repeating the step of forming the TiN unit film and the step of performing the plasma nitriding process may be in a range from 3 to 10.

The film stress of the TiN film and distribution of impurities may be controlled by controlling a thickness of the TiN unit film. The thickness of the TiN unit film amy be 3 nm to 12 nm.

The step of forming the TiN unit film and the step of performing the plasma nitriding process may be performed at a temperature of 325° C. to 450° C.

In the step of performing the plasma nitriding process, the film stress of the TiN film may be controlled by controlling a processing time or a high frequency power for generating the plasma from the nitriding gas.

In the first cycle of the step of forming the TiN unit film and the step of performing the plasma nitriding process, conditions may be set to reduce the film stress. In the first cycle and the second cycle of the step of forming the TiN unit film and the step of performing the plasma nitriding process, conditions may be set to reduce the film stress.

In accordance with a second aspect of the present invention, there is provided a computer-executable storage medium storing a program for controlling a film forming apparatus, wherein the program, when executed, controls the film forming apparatus on the computer to perform the method of forming a TiN film according to the first aspect.

DETAILED DESCRIPTION OF THE EMBODIMENTS

Hereinafter, embodiments of the present invention will be described with reference to the accompanying drawings.

Figure 1:
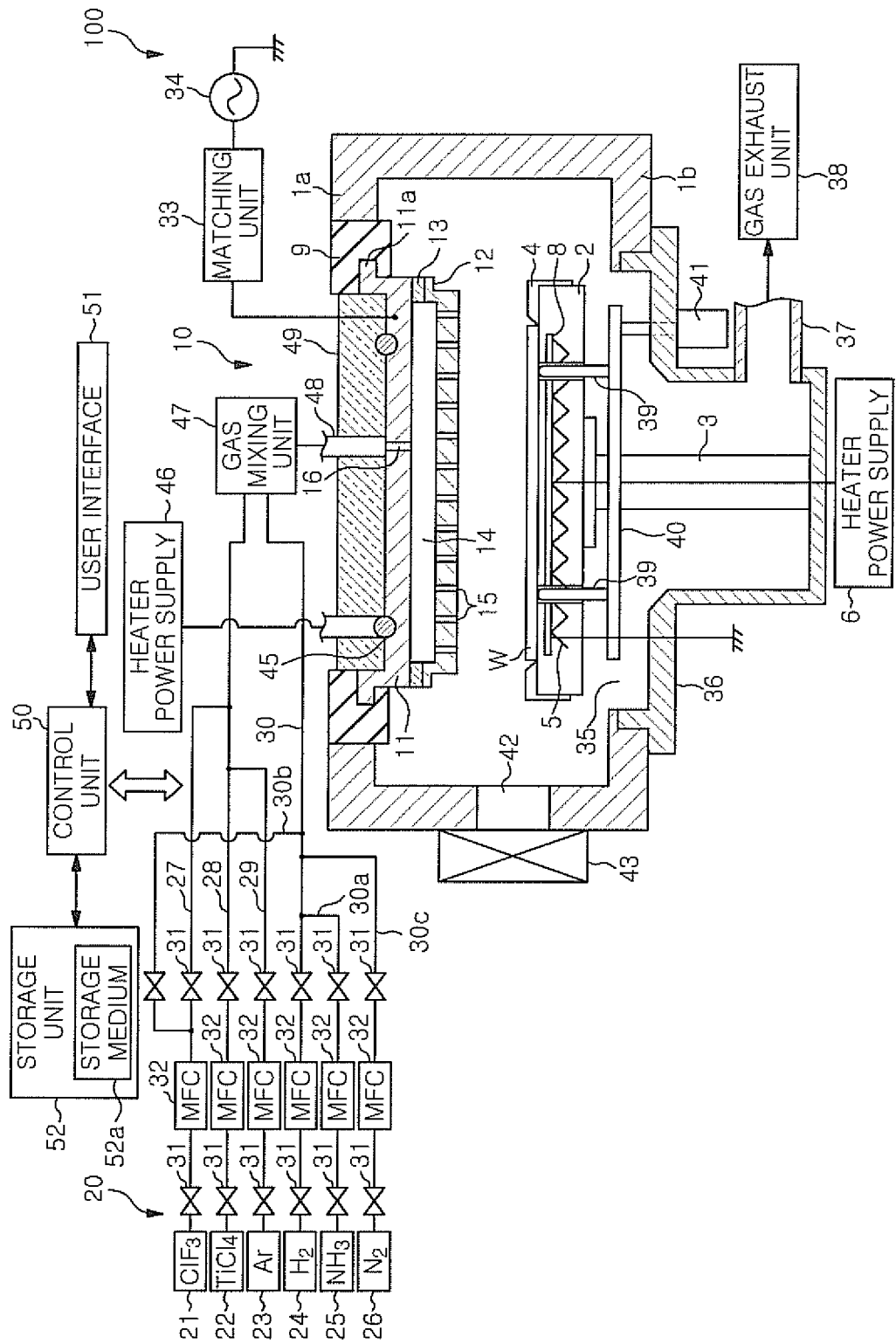
FIG. 1 is a schematic cross sectional view showing an example of a film forming apparatus used for implementing a method for forming a TiN film in accordance with an embodiment of the present invention.

FIG. 1 is a schematic cross sectional view showing an example of a film forming apparatus used for implementing a method for forming a TiN film in accordance with an embodiment of the present invention.

In the following description, mL/min is used as a unit for a gas flow rate. Since, however, a volume of a gas greatly varies depending on a temperature and an atmospheric pressure, a value of the gas volume equivalent to the standard state is used in the present invention. A flow rate equivalent to the standard state is generally expressed as sccm (Standard Cubic Centimeter per Minutes), so that "sccm" is also written. The standard state used herein indicates the state where a temperature is 0° C. (273.15 K) and an atmospheric pressure is 1 atm (101325 Pa).

The film forming apparatus 100 is configured as a PECVD (Plasma Enhanced CVD) apparatus for forming a TiN film by a CVD method while forming a plasma by generating a high frequency electric field between parallel plate electrodes. The film forming apparatus 100 includes a substantially cylindrical chamber 1. In the chamber 1, a susceptor 2 made of AlN is supported by a cylindrical supporting member 3 provided at the center of the bottom portion of the chamber 1. The susceptor 2 serves as a mounting table (stage) for horizontally supporting a wafer W as a substrate to be processed. A guide ring 4 for guiding a wafer W is provided at an outer peripheral portion of the susceptor 2. A heater 5 made of a high-melting point metal, e.g., molybdenum or the like, is buried in the susceptor 2. The heater 5 heats the wafer W as the substrate to be processed to a predetermined temperature by an electric power supplied from a heater power supply 6. An electrode B serving as a lower electrode of the parallel plate electrodes is buried in the susceptor 2 near the surface of the susceptor 2. The electrode 8 is grounded.

A pre-mix type shower head 10 is provided at a ceiling wall 1a of the chamber 1 through an insulating member 9. The shower head 10 serves as an upper electrode of the parallel plate electrodes. The shower head 10 includes a base member 11 and a shower plate 12. An outer peripheral portion of the shower plate 12 is fixed to the base member 11 by screws (not shown) through an annular intermediate member 13 for preventing adhesion. The shower plate 12 is formed in a flange shape and has a recess therein. A gas diffusion space 14 is formed between the base member 11 and the shower plate 12. A flange portion 1ie is formed at an outer periphery of the base member 11 and held by the insulation member 9. A plurality of gas injection holes 15 is formed in the shower plate 12, and a single gas inlet hole 16 is formed near the central portion of the base member 11.

The gas inlet hole 16 is connected to gas lines of the gas supply unit 20.

The gas supply unit 20 includes a $ClF_3$ gas supply source 21 for supplying $ClF_3$ gas as a cleaning gas, a $TiCl_4$ gas supply source 22 for supplying $TiCl_4$ gas as a Ti compound gas, an Ar gas supply source 23 for supplying Ar gas, an $H_2$ gas supply source 24 for supplying $H_2$ gas as a reduction gas, an $NH_3$ gas supply source 25 for supplying $NH_3$ gas as a nitriding gas, and an $N_2$ gas supply source 26 for supplying $N_2$ gas. The $ClF_3$ gas supply source 21 is connected to $ClF_3$ gas supply lines 27 and 30b. The $TiCl_4$ gas supply source 22 is connected to a $TiCl_4$ gas supply line 28. The Ar gas supply source 23 is connected to the Ar gas supply line 29. The $H_2$ gas supply source 24 is connected to an $H_2$ gas supply line 30. The $NH_3$ gas supply source 25 is connected to an $NH_3$ gas supply line 30a. The $N_2$ gas supply source 26 is connected to an $N_2$ gas supply line 30c. Each of the gas lines has a mass flow controller 32 and two valves 31 disposed to sandwich the mass flow controller 32 therebetween.

Connected to the $TiCl_4$ gas supply line 28 extended from the $TiCl_4$ gas supply source 22 are the $ClF_3$ gas supply line 27 extended from the $ClF_3$ gas supply source 21 and the Ar gas supply line 29 extended from the Ar gas supply source 23. Connected to the $H_2$ gas supply line 30 extended from the $H_2$ gas supply source 24 are the $NH_3$ gas supply line 30a extended from the $NH_3$ gas supply source 25, the $N_2$ gas supply line 30c extended from the $N_2$ gas supply source 26 and the $ClF_3$ gas supply line 30b extended from the $ClF_3$ gas supply source 21. The $TiCl_4$ gas supply line 28 and the $H_2$ gas supply line 30 are connected to a gas mixing unit 47, and a mixed gas obtained in the gas mixing unit 47 flows toward the gas inlet hole 16 through a gas pipe 48. Then, the mixed gas is introduced into the gas diffusion space 14 through the gas inlet hole 16 and injected toward the wafer W in the chamber 1 through the gas injection holes 15 of the shower plate 12.

The shower head 10 may be of a post mix type in which $TiCl_4$ gas and $H_2$ gas are completely separately supplied into the chamber 1.

As for a nitriding gas, it is possible to use $N_2$ gas, $H_2$ gas, or $NH_3$ gas. Another rare gas may be used instead of Ar gas.

A high frequency power supply 34 is connected to the shower head 10 via a matching unit 33, so that a high frequency power is supplied from the high frequency power supply 34 to the shower head 10. The gas supplied into the chamber 1 from the shower head 10 is turned into a plasma by the high frequency power supplied from the high frequency power supply 34 and a film forming process is carried out.

A heater 45 for heating the shower head 10 is provided at the base member 11 of the shower head 10. A heater power supply 46 is connected to the heater 45. The shower head 10 is heated to a predetermined temperature by power supplied from the heater power supply 46 to the heater 45. An insulating member 49 is provided at a recess formed in the upper portion of the base member 11 to improve the heating efficiency of the heater 45.

A circular opening 35 is formed at the central portion of the bottom wall 1b of the chamber 1. A gas exhaust chamber 36 protruding downward is provided at the bottom wall 1b so as to cover the opening 35. A gas exhaust line 37 is connected to a side surface of the gas exhaust chamber 36, and a gas exhaust unit 38 is connected to the gas exhaust line 37. A pressure in the chamber 1 can be reduced to a predetermined vacuum level by operating the gas exhaust unit 38.

Three wafer supporting pins 39 (only two are shown) for supporting and vertically moving the wafer W are provided at the susceptor 2 so as to protrude and retract with respect to the surface of the susceptor 2. The wafer supporting pins 39 are supported by a supporting plate 40. Further, the wafer supporting pins 39 are vertically moved through the supporting plate 40 by a driving unit 41 such as an air cylinder or the like.

A loading/unloading port 42 and a gate valve 43 are provided at the sidewall of the chamber 1. The loading/unloading port 42 allows the wafer W to be transferred to and from a wafer transfer chamber (not shown) adjacent to the chamber 1. The gate valve 43 opens and closes the loading/unloading port 42.

The components of the film forming apparatus 100, such as the heater power supplies 6 and 46, the valves 31, the mass flow controllers 32, the matching unit 33, the high frequency power supply 34, the driving unit 41 and the like are connected to and controlled by a control unit 50 having a microprocessor (computer). The control unit 50 is connected to a user interface 51 including a keyboard, a display and the like. The keyboard allows an operator to input commands for managing the film forming apparatus 100. The display visually displays the operation state of the film forming apparatus 100. The control unit 50 is connected to a storage unit 52. The storage unit 52 stores a program for executing various processes to be performed in the film forming apparatus 100 under the control of the control unit 50, or a program, i.e., a processing recipe, for executing processes of the components of the film forming apparatus 100 in accordance with processing conditions. The processing recipe may be stored in a storage medium 52a of the storage unit 52. The storage medium 52a may be a fixed one such as a hard disk or the like, or a portable one such as a CDROM, a DVD or the like. Also, the processing recipe may be appropriately transmitted from another device through, e.g., a dedicated line. If necessary, any processing recipe may be retrieved from the storage unit 52 in accordance with the instruction from the user interface 51 and executed by the control unit 50, thereby performing a desired process in the film forming apparatus 100 under the control of the control unit 50.

Next, a TiN film forming method of the present embodiment which is implemented in the above-described film forming apparatus 100 will be described.

In the present embodiment, a TiN film is formed as a metallic hard mask for etching an interlayer insulating film, e.g., a porous low-k film, which is an etching target film of a wafer W as a substrate to be processed.

First, the chamber 1 is vacuum-evacuated by the gas exhaust unit 38 and preliminarily heated by the heater 5 to a temperature of 325° C. to 450° C. while introducing Ar gas from the Ar gas supply source 23 into the chamber 1 through the shower head 10. When the temperature is stable, $TiCl_4$ gas, N, gas, $H_2$ gas, and Ar gas are introduced into the chamber 1 at respective flow rates through the shower head 10 to pre-coat the TiN film on the surfaces of the in-chamber members such as the inner wall of the chamber 1, the inner wall of the gas exhaust chamber 36, the shower head 10 and the like.

After the precoating is completed, the gate valve 43 is opened and the wafer W is loaded from the wafer transfer chamber into the chamber 1 through the loading/unloading port 42 by a transfer device (not shown) and mounted on the susceptor 2. Then, the wafer W is preliminarily heated by the heater 5 while supplying Ar gas into the chamber 1. When the temperature of the wafer is substantially stable, the formation of the TiN film is started.

Figure 2:
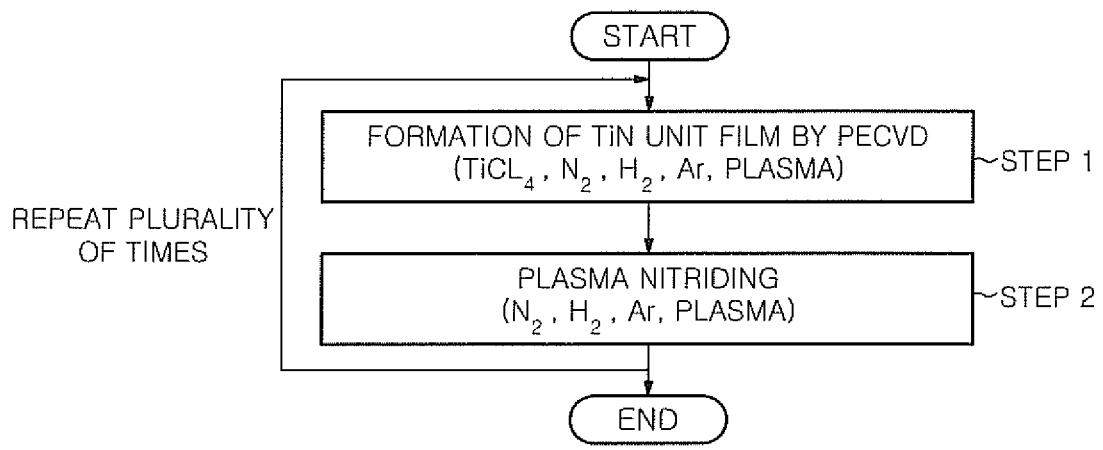
FIG. 2 is a flowchart showing the method for forming a TiN film in accordance with the embodiment of the present invention.

In the TiN film forming method of the present embodiment, the TiN film is formed as a metallic hard mask for etching the low-k film. Specifically, as shown in FIG. 2, the film formation of the TiN unit film by PECVD (step 1) and plasma nitriding using N, gas and $H_2$ gas (step 2) are repeated a plurality of times to form a TiN film with a predetermined film thickness. A film forming temperature is preferably 325° C. to 450° C. This is because when the film forming temperature is about 300° C., the film color is changed and the deliquescence phenomenon occurs and when the film forming temperature exceeds 450° C., the wiring is damaged during the wiring process.

In the step 1 of forming a TiN unit film by PECVD, while heating the wafer W and applying the high frequency power having a frequency of, e.g., 13.56 MHz from the high frequency power supply 34 to the shower head 10, $TiCl_4$ gas as a film forming material, $N_2$ gas and $H_2$ gas as a nitriding gas, and Ar gas are introduced. Accordingly, a plasma of these gases is generated and the TiN unit film is formed.

In the step 2 of performing a plasma nitriding process, while heating the wafer W and applying the high frequency power having a frequency of, e.g., 13.56 MHz from the high frequency power supply 34 to the shower head 10, $N_2$ gas, $H_2$ gas, and Ar gas are introduced to generate a plasma of these gases. Accordingly, the plasma nitriding process is performed and the nitriding of the TiN unit film is intensified. As for the nitriding gas, $NH_3$ gas may be used instead of $N_2$ gas and $H_2$ gas.

Between the steps 1 and 2, the supply of the plasma is stopped, and the inside of the chamber is purged by supplying $N_2$ gas, $H_2$ gas and Ar gas. The plasma state in the step 1 is different from that in the step 2, so that the setting of the matching unit 33 (the setting of the variable capacitor) is changed. Or, the setting of the matching unit may be adjusted while maintaining the plasma state between the step 1 and the step 2.

The followings are preferable conditions for the steps 1 and 2.

Temperature: 325 to 450° C.
(more preferably 350 to 400° C.)
Pressure: 13.3 to 1330 Pa
(more preferably 133 to 800 Pa)
$TiCl_4$ flow rate: 5 to 100 mL/min(sccm)
(more preferably 15 to 50 mL/min(sccm))
Ar flow rate: 5 to 10000 mL/min(sccm)
(more preferably 100 to 5000 mL/min(sccm))
flow rate: 5 to 10000 mL/min(sccm)
(more preferably 50 to 5000 mL/min(sccm))
flow rate: 1 to 5000 mL/min(sccm)
(more preferably 10 to 1000 mL/min(sccm))
$NH_3$ flow rate: 1 to 10000 mL/min(sccm)
(more preferably 10 to 5000 mL/min(sccm))
High frequency power: 100 to 5000 W
(more preferably 300 to 3000 W)
Film thickness obtained by single film formation: 0.1 to 40 nm
(more preferably 1 to 10 nm)
Time for single nitriding process: 0.1 to 60 sec
(more preferably 1 to 30 sec)

In this manner, the TiN unit film is formed by using plasma of $TiCl_4$ gas and nitriding gas, so that the reactivity between Ti and N is increased. Even when the film is formed at a low temperature of 400° C. or below, strong Ti—N bonds can be obtained and the concentration of impurities (Cl and the like) in the film can be reduced. By performing the plasma nitriding process after the formation of the TiN unit film, the nitriding is intensified and the concentration of impurities (Cl and the like) in the film is further reduced. In addition, the film stress can be decreased. The TiN film of the present embodiment, which is formed by repeating the above-described processes, has strong Ti—N bonds and thus has a high etching resistance required for a metallic hard mask. A finally obtained TiN film can have a very small amount of impurities and a low stress by appropriately controlling a film thickness obtained by one film formation of the TiN unit film, a nitriding time, the number of repetition or the like. By using such a TiN film for a metallic hard mask in the case of using a porous low-k film having a low mechanical strength as an etching target film, the deformation of the groove pattern can be suppressed. Specifically, it is possible to obtain a TiN film having a stress of which absolute value is about $5 \times 10^9$ dyne/cm$^2$ or less and preferably $1 \times 10^9$ dyne/cm$^2$ or less and a resistivity of 150 $\mu\Omega$·cm or less, which is the index of the concentration of impurities.

Figure 3:
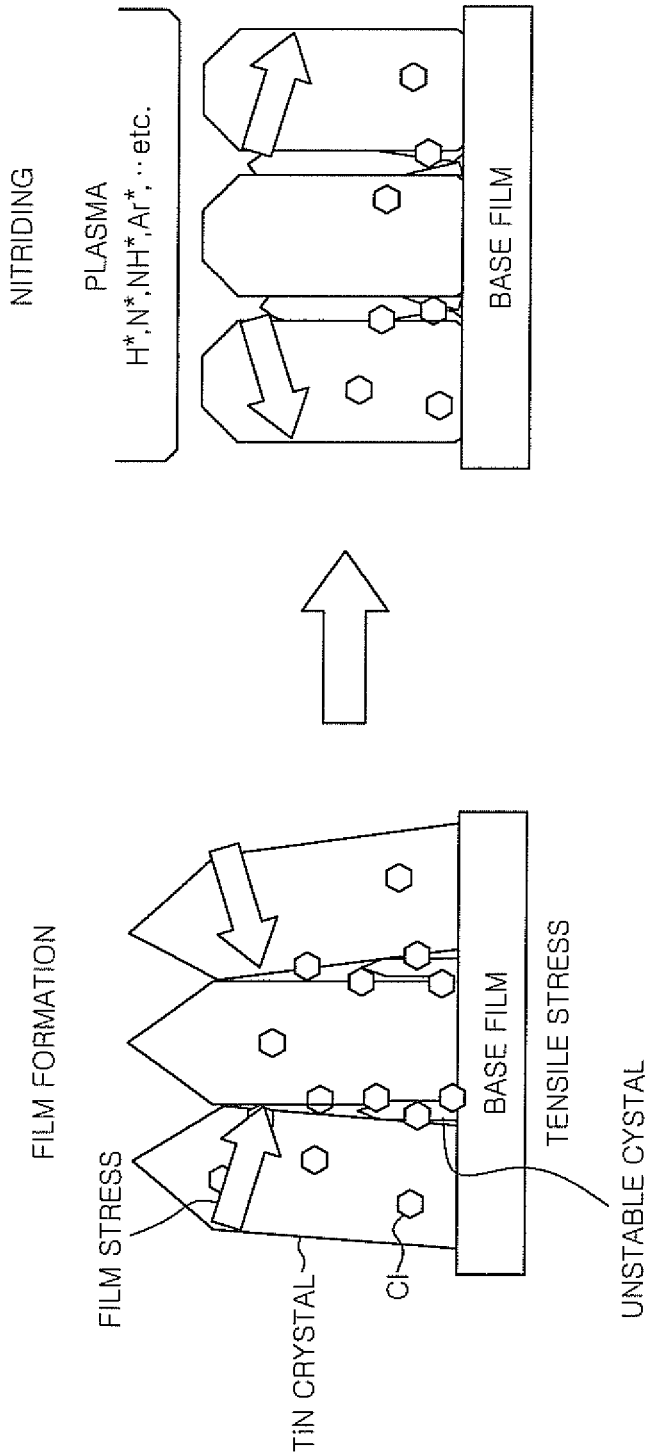
FIG. 3 shows a stress controlling mechanism of a TiN film.

The mechanism for controlling the stress of the TiN film will be described with reference to FIG. 3. A TiN crystal has a columnar shape, so that a tensile stress is applied to the film in the film forming step. As the amount of Cl as an impurity in the film is gradually decreased due to the nitriding performed after the film formation, a compressive stress is applied to the film and the tensile stress is relaxed to make the film have a low stress. The tensile stress at this time and the compressive stress during the nitriding can be controlled in accordance with conditions such as a thickness of a TiN unit film, a nitriding time, a high frequency (RF) power, a pressure, a processing gas, the number of cycles and the like. Therefore, the film stress can be controlled by controlling such conditions. The film stress in the positive direction indicates the tensile stress, and the film stress in the negative direction indicates the compressive stress. A low stress denotes that an absolute value of the stress is small.

Next, the effects of the respective conditions on the film stress and the concentration of impurities will be described.

First, the effects of the number of repetition of the steps 1 and 2 will be described. Here, the film was formed under the following two conditions A and B. In order to examine the effects of the number of cycles, target film thicknesses were set to the same value by setting the same total film forming time and the same total nitriding time. Therefore, the film thickness of the TiN unit film is increased as the number of repetition of the steps 1 and 2 is small, and is decreased as the number of repetition of the steps 1 and 2 is large. Hereinafter, the number of repetition will be referred to as "the number of sub-cycles for TiN film".

Figure 4:
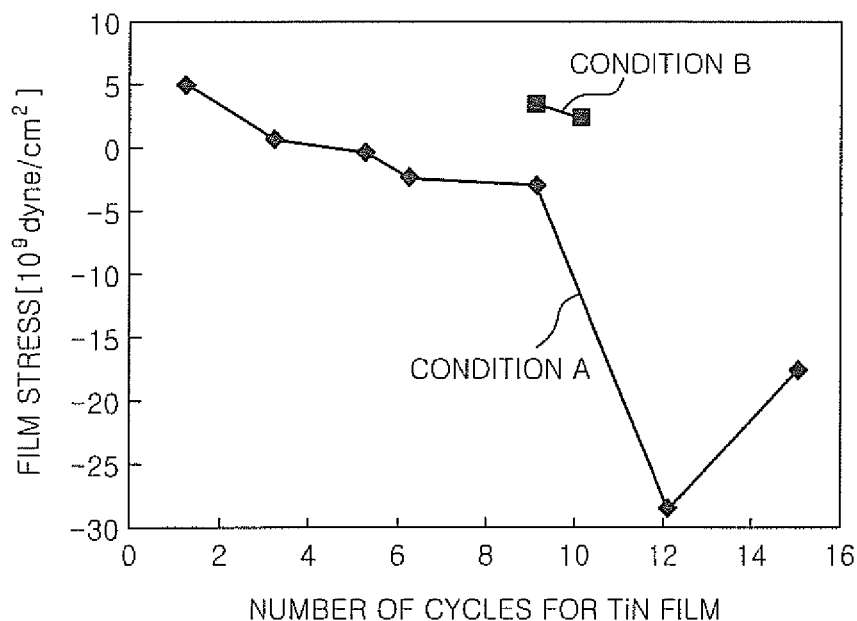
FIG. 4 shows relationship between a stress of a TiN film and the number of repetition of film formation in step 1 and nitriding in step 2 (the number of sub-cycles for TiN film).

(Condition A)
Wafer temperature: 400° C.
Sequence (repeating the following)
RF application→film formation (Dep)→source gas supply stop→gas type change 1→nitriding→gas type change 2
The number of sub-cycles for TiN film: 1, 3, 5, 6, 9, 12, 15
Film formation
Pressure: 260 Pa
TiCl$_4$ flow rate: 31.4 mL/min(sccm)
Ar flow rate: 1600 mL/min(sccm)
H$_2$ flow rate: 4000 mL/min(sccm)
N$_2$ flow rate: 400 mL/min(sccm)
RF: 1200 W
Total film forming time: 30 sec
Nitriding
Pressure: 667 Pa
Ar flow rate: 1600 mL/min(sccm)
H$_2$ flow rate: 4000 mL/min(sccm)
N$_2$ flow rate: 400 mL/min(sccm)
RF: 1200 W
Total nitriding time: 45 sec
Target film thickness: 30 nm
Relationship between the number of sub-cycles for TiN film and film formation·nitriding time
1→film forming time of 30 sec, nitriding time of 45 sec
3→film forming time of 10 sec, nitriding time of 15 sec
5→film forming time of 6 sec, nitriding time of 9 sec
6→film forming time of 5 sec, nitriding time of 7.5 sec
9→film forming time of 3.4 sec, nitriding time of 5 sec
12→film forming time of 2.5 sec, nitriding time of 3.6 sec
15→forming time of 2 sec, nitriding time of 3 sec
(Condition B)
Wafer temperature: 350° C.
Sequence (repeating the following)
RF application→film formation (Dep)→gas type change 1→nitriding→gas type change 2
The number of sub-cycles for TiN film: 9 and 10
Film formation
Pressure: 260 Pa
TiCl$_4$ flow rate: 38 mL/min(sccm)
Ar flow rate: 1600 mL/min(sccm)
H$_2$ flow rate: 1600 mL/min(sccm)
N$_2$ flow rate: 400 mL/min(sccm)
RF: 1350 W
Total film forming time: 28 sec
Nitriding
Pressure: 260 Pa
Ar flow rate: 1600 mL/min(sccm)
H$_2$ flow rate: 4000 mL/min(sccm)
N$_2$ flow rate: 400 mL/min(sccm)
RF: 1350 W
Total nitriding time: 66 sec
Target film thickness: 30 nm
Relationship between the number of sub-cycles for TiN film and film formation/nitriding time
9→film forming time of 3.1 sec, nitriding time of 7 sec
10→film forming time of 2.8 sec, nitriding time of 6.6 sec FIG. 4 shows relationship between the film stress and the number of sub-cycles for the TiN film in the case of performing film formation under the above conditions. In FIG. 4, the film stress in the positive side of the vertical axis indicates a tensile stress and the film stress in the negative side of the vertical axis indicates a compressive stress. As illustrated in FIG. 4, the film stress is not greatly changed until the number of sub-cycles reaches 10. However, when the number of sub-cycles exceeds 10 and is in the range from 12 to 15, the film stress is rapidly and greatly shifted toward a compressive stress. From this, it is clear that it is difficult to decrease the film stress when the number of sub-cycles for the TiN film exceeds 10.

The reason for changes in the stress is considered as follows. As can be seen from the result of the elementary analysis of the film which will be described later (FIG. 6), Cl remains in the film during the film formation until the number of sub-cycles for the TiN film reaches 10, so that the amount of Cl as an impurity in the film is gradually decreased by the nitriding process and a Ti/N composition ratio of the TiN film becomes close to 1:1. However, in the film formation of the case where the number of sub-cycles for the TiN film is in the range from 12 to 15, the concentration of impurities in the film is considerably low and, thus, Cl as an impurity is hardly removed during the nitriding process and the TiN film starts to be nitrided excessively. Therefore, the expansion type of the film itself is changed and the stress is abruptly changed. Thus, in order to decrease the film stress, the number of sub-cycles is preferably 10 or less.

Figure 5:
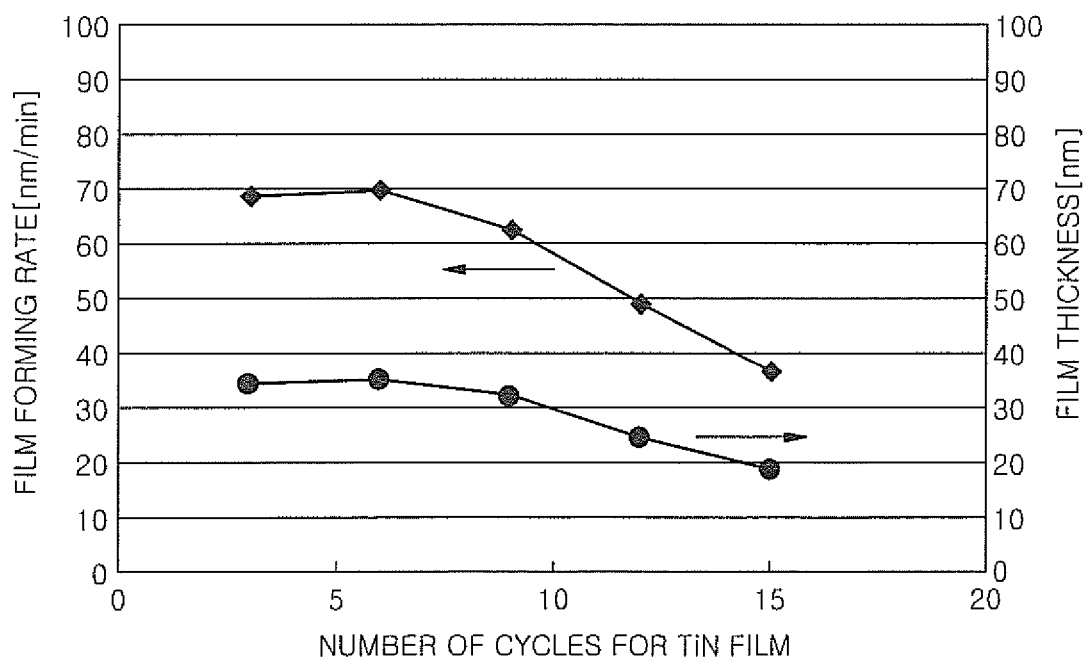
FIG. 5 shows relationship among a film thickness, a film forming rate and the number of repetition of film formation in step 1 and nitriding in step 2 (the number of sub-cycles for TiN film).

FIG. 5 shows relationship among the film thickness, the film forming rate and the number of sub-cycles for forming the TiN film. As can be seen from FIG. 5, as the number of sub-cycles is increased, the film thickness is decreased whereas the film forming rate is decreased. An excessive increase in the number of sub-cycles is not preferable in view of a throughput.

Figure 6:
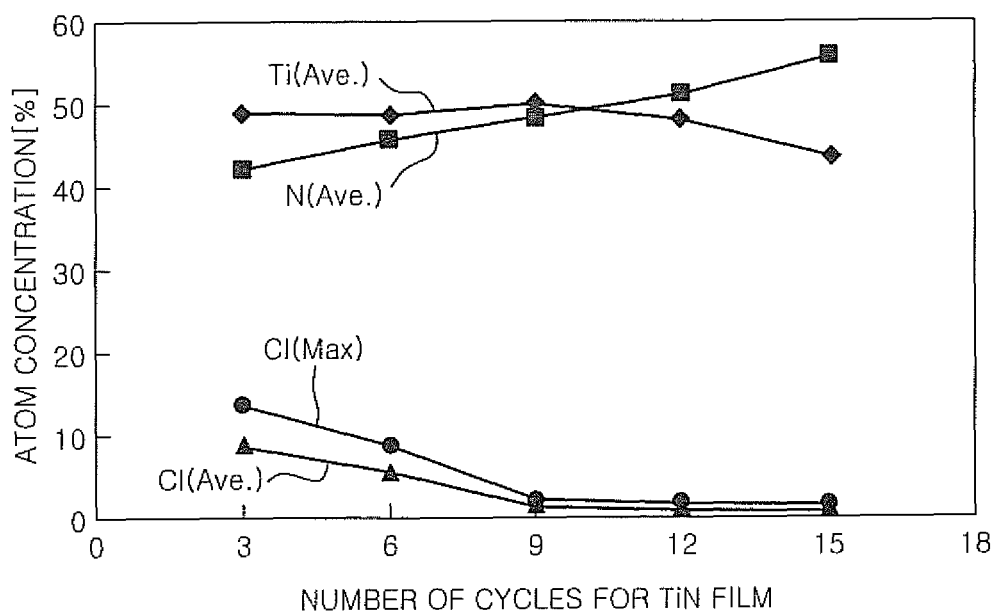
FIG. 6 shows relationship between the number of repetition of film formation in step 1 and nitriding in step 2 (the number of sub-cycles for TiN film) and concentration of Cl, Ti and N in the TiN film.
Figure 7:
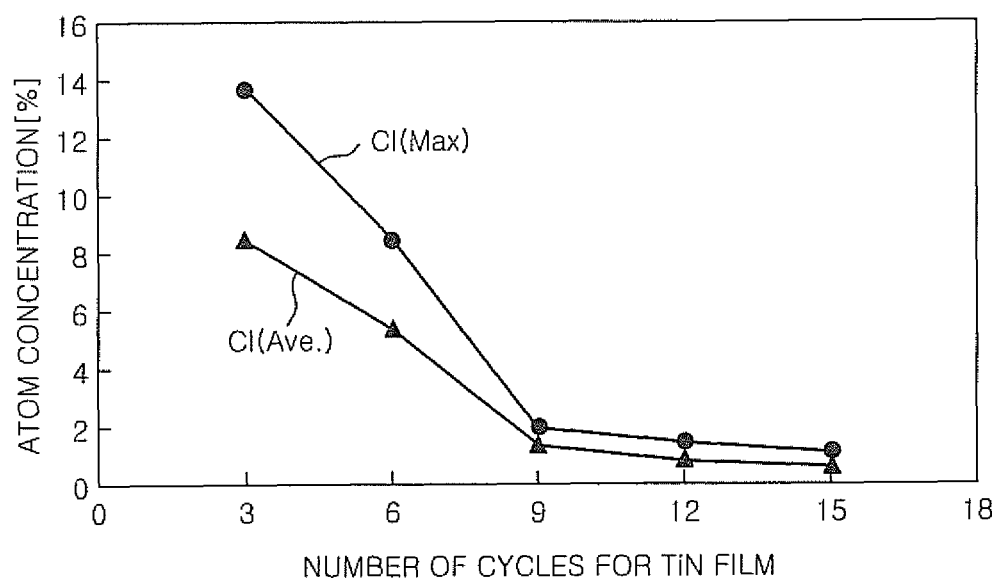
FIG. 7 shows only the concentration of Cl in FIG. 6.

Next, the result of elementary analysis performed on the TiN film formed under the condition A by XPS will be described. FIG. 6 shows relationship between the number of sub-cycles for the TiN film and concentration of Cl, Ti and N in the film. FIG. 7 shows only the concentration of Cl shown in FIG. 6. With respect to Cl, an average (Ave.) and a maximum value (Max) of Cl are shown.

As can be seen from FIGS. 6 and 7, as the number of sub-cycles for the TiN film is increased, the Cl concentration is decreased. However, as the number of sub-cycles exceeds 9, the Cl concentration is hardly changed. When the number of sub-cycles for the TiN film exceeds 12, the amount of nitrogen is greater than that of titanium, and the effect of decreasing Cl reaches the peak. Therefore, it is considered that the useless increase of nitrogen causes the film stress. When the number of sub-cycles for the TiN film is 3, the concentration of Cl is somewhat high but within in a tolerable range.

From the above, it is clear that the number of sub-cycles for film formation is preferably 3 to 10 in consideration of both of the film stress and the concentration of Cl. The above result was obtained in the case of setting the target film thickness to 30 nm, and thus may be applied to the case of setting the target film thickness to 10 to 40 nm.

A film thickness per one cycle, i.e., a thickness of a TiN unit film, directly affects a stress of a finally obtained TiN film or the removal of impurities. Therefore, it is preferable to control the stress of the TiN film and the distribution of impurities by controlling the thickness of the TiN unit film. In consideration of the above result, the thickness of the TiN unit film is preferably 3 to 12 nm.

Figure 8:
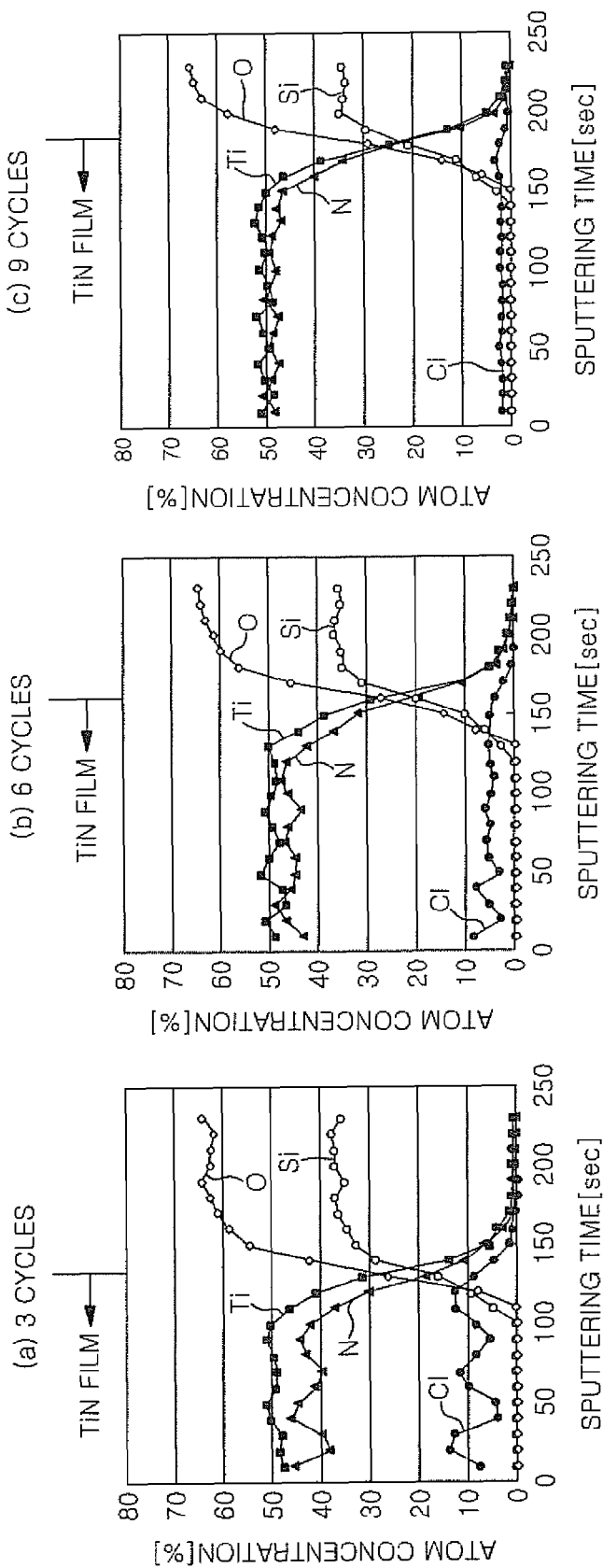
FIGS. 8A to 8C show results of elementary analysis in a depth direction by X-ray photoelectron spectroscopy (XPS) in the case where the number of sub-cycles is 3, 6 and 9.

Next, a result of elementary analysis performed in a depth direction by XPS in the case where the number of sub-cycles for the TiN film is 3, 6 and 9 is shown in FIGS. 8A to 8C. In FIGS. 8A to 8C, the horizontal axis indicates a sputtering time. The sputtering time corresponds to a depth. As can be seen from FIGS. 8A to 8C, when the number of sub-cycles for the TiN film is 3, three high concentration portions of Cl and three low concentration portions of Cl are periodically observed in the depth direction of the film, and the film composition (Cl concentration) is not uniform in the depth direction of the film. On the other hand, when the number of sub-cycles for the TiN film is 6, the Cl concentration is not uniform near the surface of the film but is uniform at the base side, which indicates that the film composition (Cl concentration) in the film is substantially stable. When the number of sub-cycles for the TiN film is 9, the Cl concentration in the depth direction of the film is hardly changed. In order to apply the TiN film of the present embodiment to the metallic hard mask, it is preferable that the etching direction is not changed. However, if the composition ratio is changed in the depth direction, the etching direction is changed. From the above, it is clear that the number of sub-cycles for the TiN film is preferably 6 and 9 rather than 3, and more preferably 9.

Figure 9:
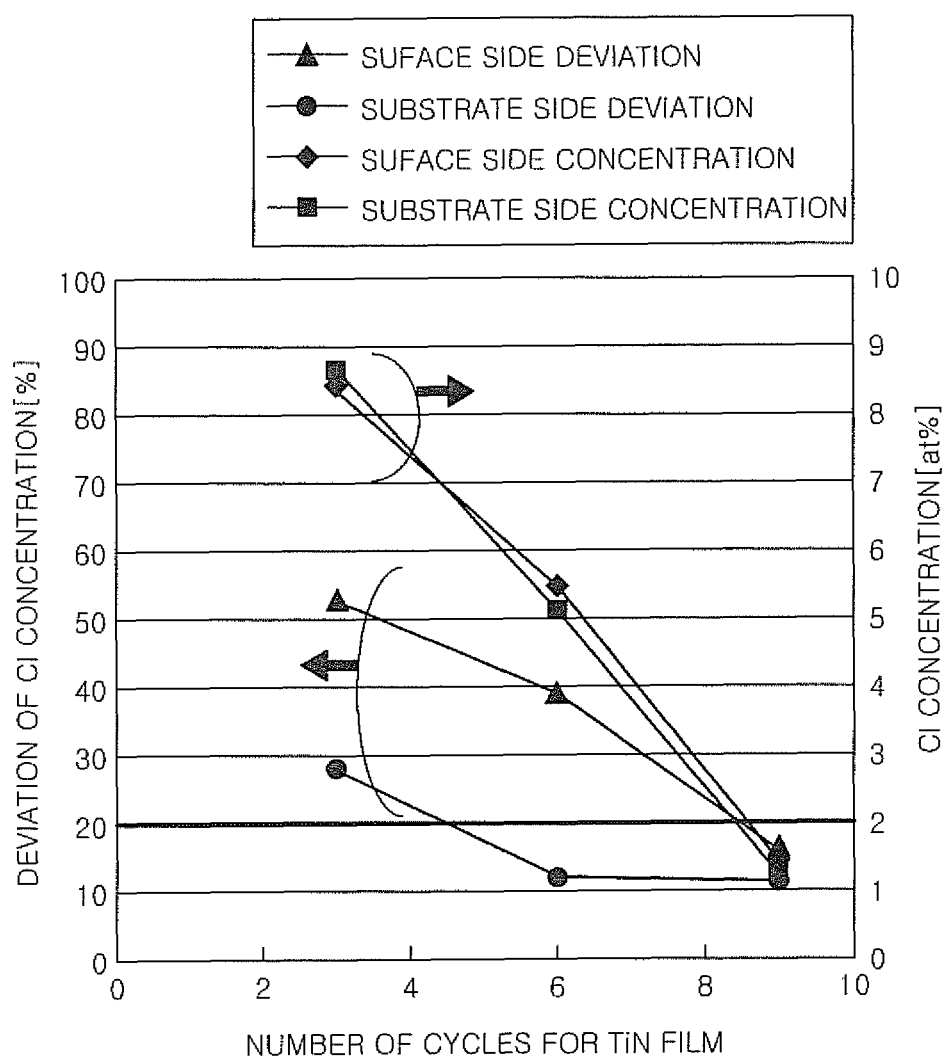
FIG. 9 shows Cl concentration and deviation on the substrate and the surface of the TiN film in the case where the number of sub-cycles is 3, 6 and 9.

Next, a result of detailed examination on concentration of Cl and deviation thereof in the cases of setting the number of sub-cycles for the TiN film to 3, 6 and 9 under the conditions A will be described. Here, a finally obtained TiN film is divided into two of a surface side and a substrate side in a thickness direction, and the Cl concentration in the thickness direction was measured by XPS. The result thereof is shown in FIG. 9. As can be seen from FIG. 9, the Cl concentration and the deviation thereof are decreased as the number of sub-cycles is increased. The deviation of the Cl concentration is smaller at the substrate side than at the surface side in any sub-sub-cycle number. When the number of sub-cycles is 3, the distribution of the Cl concentration at the substrate side as well as the surface side is high. When the number of sub-cycles is 6, the deviation of the Cl concentration at the surface side is high, whereas the deviation of the Cl concentration at the substrate side is low and stable. When the number of sub-cycles is 9, the deviations of the Cl concentrations at the substrate side and the surface side are low and a film is stably formed. From the above, it is clear that the number of sub-cycles is preferably 6 and 9 rather than 3, and more preferably 9.

Next, the effects of the plasma nitriding process (step 2) on the stress of the TiN film will be described.

Here, a TiN film was formed by repeating the formation of a TiN unit film in the step 1 and the nitriding in the step 2 in the following cycles (hereinafter, referred to as "the number of cycles") while fixing the conditions of the film formation in the step 1 and varying the conditions of the plasma nitriding process in the step 2, and the film stress was examined.

Basic conditions are as follows.
Temperature: 400° C.
The number of cycles: 9
Film formation
Pressure: 260 Pa
$TiCl_4$ flow rate: 38 mL/min(sccm)
Ar flow rate: 1600 mL/min(sccm)
$H_2$ flow rate: 3000 mL/min(sccm)
$N_2$ flow rate: 400 mL/min(sccm)
RF: 1200 W
Time for single film formation: 3.8 sec
Nitriding
Pressure: 260 Pa
Ar flow rate: 1600 ml/min(sccm)
$H_2$ flow rate: 4000 mL/min(sccm)
$N_2$ flow rate: 400 mL/min(sccm)

Figure 10:
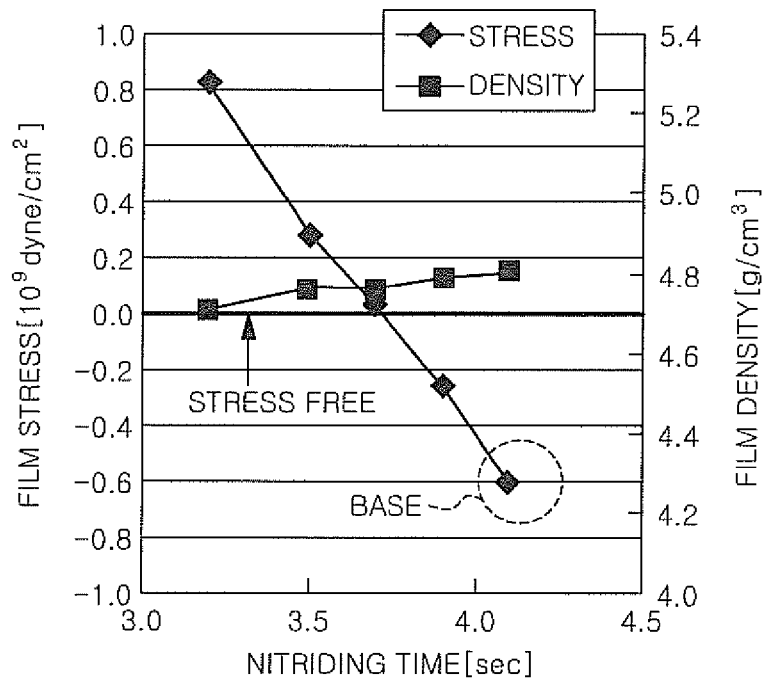
FIG. 10 shows relationship between a nitriding time and a film density and relationship between a stress of a TiN film and a nitriding time in the case of varying time for a single nitriding process while fixing an RF power for nitriding to about 1200 W.

FIG. 10 shows relationship between nitriding time and a film density and relationship between nitriding time and a stress of a TiN film in the case of varying time for a single nitriding process while fixing an RF power for nitriding to 1200 W.

As shown in FIG. 10, as the nitriding time increases, the stress of the TiN film is shifted toward a compressive stress side. From this, it is clear that the stress of the film can be shifted by changing the nitriding time. When the nitriding time is short, the stress of the film is a tensile stress. As the nitriding time increases, the stress of the film is shifted to a compressive stress side. Therefore, a TiN film having no stress can be formed by controlling the nitriding time.

Also, it is clear that the density of the film is hardly changed even if the stress of the film is shifted by changing the nitriding time.

Generally, a stress of a TiN film is decreased by reducing the amount of N in a TiN film by changing a nitriding ratio of the TiN film. Since, however, the stress is decreased by reducing the number of N in the film, the amount of Ti in the TiN film is increased, and the film density as well as the stress is decreased. On the other hand, in the present embodiment, the plasma treatment using $TiCl_4$ gas and $N_2$ gas is performed during the film formation. Therefore, strong Ti—N bonds are formed during the film formation, which determines a main structure of the film. By controlling the tensile stress during the film formation to a low level of $3 \times 10^9$ to $8 \times 10^9$ dyne/cm$^2$ in advance, it is possible to remove impurities in the TiN film and intensify the nitriding without greatly affecting the main structure of the film in the plasma nitriding process to be performed after the film formation. In addition, the fine control of the stress of the TiN film can be carried out. Accordingly, the fine control of the film stress can be carried out without greatly changing the film density.

Figure 11:
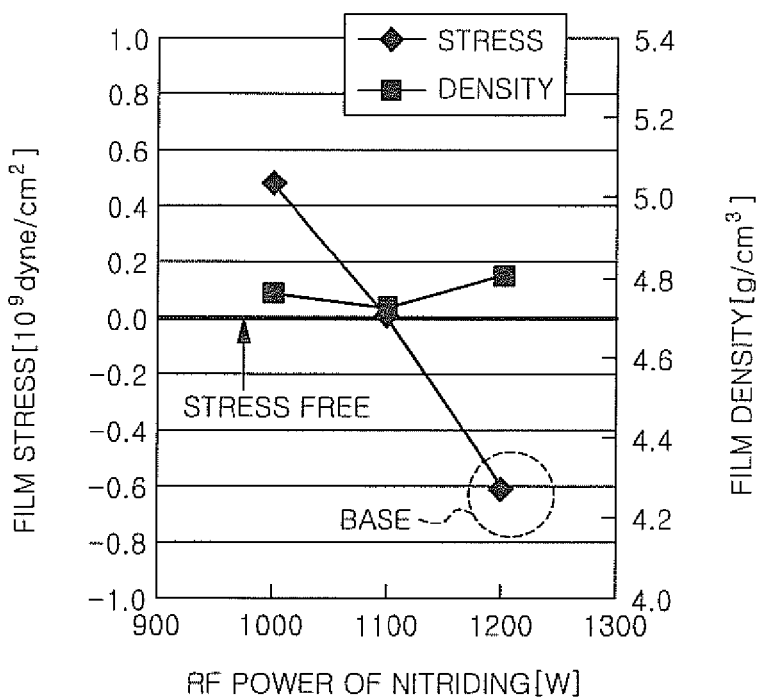
FIG. 11 shows relationship between a film density and the RF power and relationship between a stress of a TiN film and the RF power in the case of varying the RF power while fixing a nitriding time to about 4.1 sec.

FIG. 11 shows relationship between an RF power and a film density and relationship between a stress of a formed TiN film and an RF power in the case of varying an RE power while fixing a nitriding time to about 4.1 sec.

As shown in FIG. 11, as the RF power increases, the stress of the TiN film is shifted toward a compressive stress side. Even if the RF power is changed, the film density is hardly changed. From the above, it is clear that the stress can be controlled by changing the RF power without greatly changing the film density and the TiN film having no stress can be obtained by such control.

Figure 12:
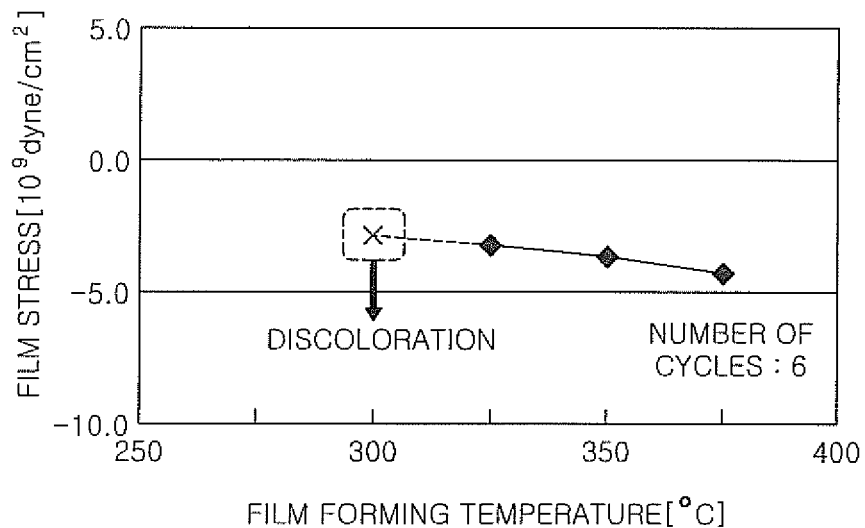
FIG. 12 shows relationship between a film formation temperature and a stress of a TiN film.

Hereinafter, a result of examination on relationship between a film forming temperature and a stress will be described. Here, a film stress was measured while varying the temperature within a range of 300° C. to 375° C. and setting time for single film formation to 5.5 sec, time for a single nitriding process to 8.0 sec and the number of cycles to 6. The result thereof is shown in FIG. 12. The color of the film was changed at 300° C., and the absolute value of the film stress was $5 \times 10^9$ dyne/cm$^2$ or less at 325° C. to 375° C.

Next, a result of examination on a film stress in an initial stage of the film formation will be described.

Figure 13:
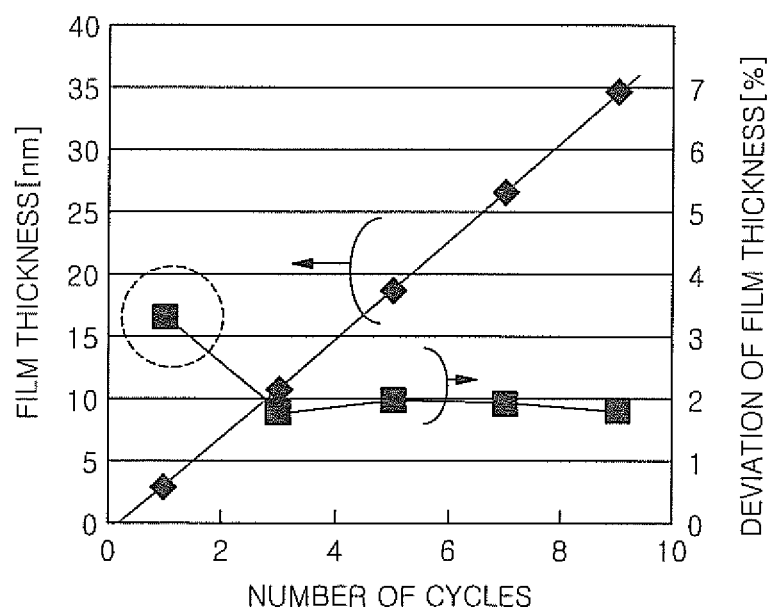
FIG. 13 shows relationship between the number of cycles in the case of forming a TiN film, a film thickness, and in-plane deviation of the film thickness.
Figure 14:
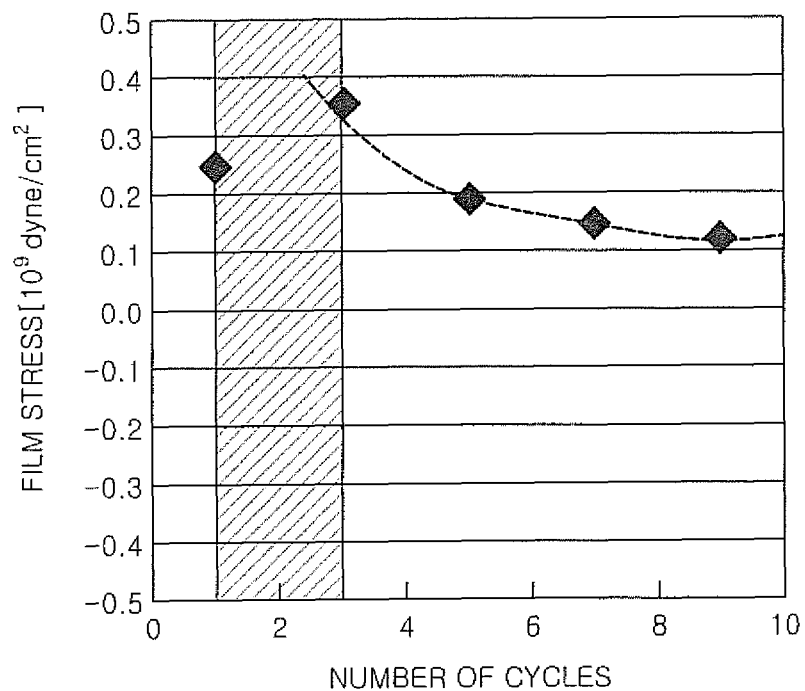
FIG. 14 shows relationship between a film stress and the number of cycles in the case of forming a TiN film.

FIG. 13 shows relationship among a film thickness, in-plane deviation of the film thickness (non-uniformity), and the number of cycles in the case of forming a TiN film. FIG. 14 shows relationship between the stress of the film and the number of cycles in the case of forming a TiN film.

As shown in FIG. 13, the film thickness of the TiN film is changed linearly from the first cycle to the ninth cycle, and the number of cycles and the film thickness satisfy a proportional relationship that substantially passes through the origin. Therefore, there is no incubation time, and the film is formed with the substantially same thickness in each cycle. However, the in-plane deviation of the film thickness in the first cycle is high and has a different tendency from those of the other cycles. As can be seen from FIG. 14, the film stress is gradually decreased after the third cycle and discontinuous only in the first cycle. From the above, it is clear that the growth of the film in the first cycle is different from that in the other cycles.

In the case of forming a TiN film as a metallic hard mask on the porous low-k film, if a stress is produced during film formation, it may affect the porous low-k film. Therefore, it is important to control the film formation in an initial cycle of the film formation.

Figure 15:
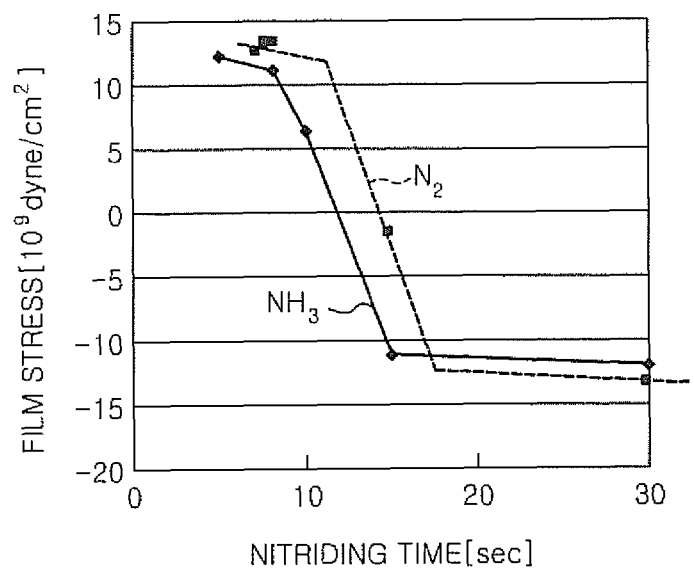
FIG. 15 shows relationship between a nitriding time and a film stress in the case of performing only one cycle of film formation and nitriding.

Therefore, the stress of the film was controlled by changing the nitriding time in the case of performing one cycle of film formation using PECVD and a plasma nitriding process. Here, a nitriding process using $N_2$ gas and $H_2$ gas and a nitriding process using $NH_3$ gas were carried out. FIG. 15 shows relationship between the nitriding time and the film stress. As can be seen from FIG. 15, the film stress was abruptly changed from the tensile stress to the compressive stress at the nitriding time of 10 sec to 15 sec regardless of types of nitriding gases and it was difficult to control the stress in the first cycle.

Figure 16:
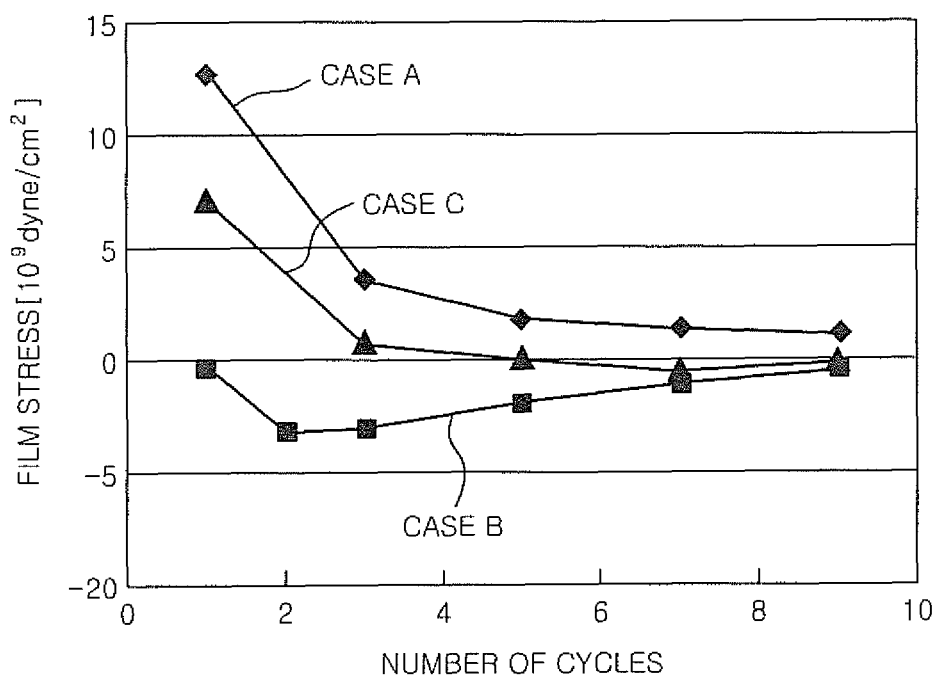
FIG. 16 shows a stress of a film in each cycle in the case of forming a TiN film by performing nine cycles under the same conditions (case A), in the case of reducing a stress of a film by changing the conditions of a first cycle (case B), and in the case of reducing a stress of a film by changing the conditions of the first cycle and a second cycle (case C).

Based on the above, the case of controlling the film stress in the initial cycle of the film formation and the case of not controlling the film stress in the initial cycle of the film formation were compared. FIG. 16 shows the film stress in each cycle in the case of forming a TiN film by performing nine cycles under the same conditions (case A), the case of reducing the film stress by changing the conditions for the first cycle (case B), and the case of reducing the film stress by changing the conditions for the first and the second cycle (case C), as will be described below.

The conditions at this time are as follows.

1. Common Conditions
Temperature: 400° C.
Film formation
Pressure: 260 Pa
TiCl$_4$ flow rate: 31.4 mL/min(sccm)
Ar flow rate: 1600 mL/min(sccm)
H$_2$ flow rate: 1600 mL/min(sccm)
N$_2$ flow rate: 400 mL/min(sccm)
RF: 1200 W
Film forming time: 3.9 sec/cycle
Target film thickness: 3.7 nm/cycle
Nitriding
Pressure: 260 Pa
Ar flow rate: 1600 mL/min(sccm)
H$_2$ flow rate: 4000 mL/min(sccm)
N$_2$ flow rate: 400 mL/min(sccm)
RF: 1200 W 2. Case A
The film was formed by performing each cycle under the above conditions.
Nitriding time: 7.1 sec/cycle 3. Case B
Conditions for the First Cycle
Film formation
Pressure: 260 Pa
TiCl$_4$ flow rate: 31.4 mL/min(sccm)
Ar flow rate: 1600 mL/min(sccm)
H$_2$ flow rate: 4000 mL/min(sccm)
N$_2$ flow rate: 400 mL/min(sccm)
RF: 1200 W
Film forming time: 3.9 sec/cycle
Nitriding
Pressure: 260 Pa
Ar flow rate: 1600 mL/min(sccm)
H$_2$ flow rate: 4000 mL/min(sccm)
NH$_3$ flow rate: 400 mL/min(sccm)
RF: 1200 W
Nitriding time: 10 sec
Conditions for the second to the ninth cycle
Film formation: the above common conditions
Nitriding: the above common conditions, nitriding time: 6.1 sec/cycle 4. Case C
Conditions for the First Cycle
Film formation
Pressure: 260 Pa
TiCl$_4$ flow rate: 31.4 mL/min(sccm)
Ar flow rate: 1600 mL/min(sccm)
H$_2$ flow rate: 4000 mL/min(sccm)
N$_2$ flow rate: 400 mL/min(sccm)
RF: 1200 W
Film forming time: 3.9 sec/cycle
Nitriding
Pressure: 260 Pa
Ar flow rate: 1600 mL/min(sccm)
H$_2$ flow rate: 4000 mL/min(sccm)
NH$_3$ flow rate: 400 mL/min(sccm)
RF: 1200 W Nitriding time: 9.1 sec
Conditions for the Second Cycle
Film formation: the above common conditions
Nitriding: the above common conditions, nitriding time: 8.1 sec/cycle
Conditions for the Third to Ninth Cycle
Film formation: the above common conditions
Nitriding: the above common conditions, nitriding time: 7.6 sec/cycle As can be seen from FIG. 16, in any of the cases, the stress of the finally obtained film is close to zero. However, in the case A in which each cycle is performed under the same conditions without considering the stress in each cycle, the stress in the first cycle was comparatively high. Meanwhile, in the case B in which the film stress in the first cycle was reduced to about zero by controlling the nitriding time in the first cycle, the stress was low as a whole but shifted to a compressive stress after the second cycle. In the case C in which the film stress in the second cycle was controlled to about zero, the film stress in the first cycle was slightly higher than that in the case B. However, it became stable and was maintained at a low level after the third cycle.

In accordance with the test described above, the TiN film formed by repeating the step of forming a TiN unit film by plasma CVD using a $TiCl_4$ gas and a nitriding gas and a step for performing a plasma nitriding process has reduced impurities and a considerably low stress by appropriately controlling various conditions such as the number of repetition of cycles, nitriding process conditions and the like. The TiN film thus obtained is suitable for a metallic hard mask when etching a porous low-k film.

As described above, in the present embodiment, the TiN unit film is formed by using the plasma of $TiCl_4$ gas and nitriding gas and, thus, the reactivity between Ti and N is increased, and strong Ti—N bonds can be obtained even when the film is formed at a low temperature of 400° C. or less. In addition, the concentration of impurities in the film can be reduced. By performing the plasma nitriding process after the formation of the TiN unit film, the nitriding is intensified and the concentration of impurities in the film can be further reduced. Besides, the film stress can be reduced. The TiN film of the present embodiment formed by repeating the film formation and the nitriding has high etching resistance required for a metallic hard mask due to strong Ti—N bonds. The finally obtained TiN film can have a considerably low stress and reduced impurities by properly controlling a film thickness obtained by a single step of forming a TiN unit film, nitriding time, the number of repetition of cycles and the like. Moreover, the deformation of the groove pattern can be prevented by using such a TiN film as a metallic hard mask for etching a porous low-k film having a low mechanical strength which is an etching target film.

The present invention can be variously modified without being limited to the above embodiment. For example, the film forming apparatus of the above embodiment which is shown in FIG. 1 is merely an example, and the present invention is not limited to the apparatus shown in FIG. 1.

DESCRIPTION OF REFERENCE NUMERALS

1: chamber
2: susceptor
5: heater
10: shower head
20: gas supply unit
22: $TiCl_4$ gas supply source
23: Ar gas supply source
24: $H_2$ gas supply source
25: $NH_3$ gas supply source
26: $N_2$ gas supply source
50: control unit
52: storage unit
52a: storage medium
100: film forming apparatus
W: semiconductor wafer

What is claimed is:

1. A method of forming a TiN film to be used as a metallic hard mask in etching of an etching target film formed on a substrate to be processed, the method comprising:
alternately repeating a step of forming a TiN unit film and a step of performing a plasma nitriding process on the TiN unit film to form a TiN film having a reduced film stress,
wherein the step of forming the TiN unit film is performed by loading the substrate to be processed into a processing chamber, supplying $TiCl_4$ gas and a nitriding gas into the processing chamber while maintaining an inside of the processing chamber in a depressurized state, and generating a plasma from the $TiCl_4$ gas and the nitriding gas,
wherein the step of performing the plasma nitriding process is performed by supplying a nitriding gas into the processing chamber and generating a plasma from the nitriding gas,
wherein a film thickness of the TiN film is 10 to 40 nm, and the number of repeating the step of forming the TiN unit film and the step of performing the plasma nitriding process is in a range from 3 to 10, and
wherein a film stress of the TiN film subjected to the second cycle of the step of forming the TiN unit film and the step of performing the plasma nitriding process is controlled to about zero.

2. The method of claim 1, wherein the TiN film having the reduced stress is formed by reducing a tensile stress of the TiN unit film formed in the step of forming the TiN unit film during the step of performing the plasma nitriding process.

3. The method of claim 1, wherein the film stress of the TiN film and distribution of impurities are controlled by controlling a thickness of the TiN unit film.

4. The method of claim 3, wherein the thickness of the TiN unit film is 3 nm to 12 nm.

5. The method of claim 1, wherein the step of forming, the TiN unit film and the step of performing the plasma nitriding process are performed at a temperature of 325° C. to 450° C.

6. The method of claim 1, wherein in the step of performing the plasma nitriding process, the film stress of the TiN film is controlled by controlling a processing time or a high frequency power for generating the plasma from the nitriding gas.

7. The method of claim 1, wherein in the first cycle of the step of forming the TiN unit film and the step of performing the plasma nitriding process, conditions are set to reduce the film stress.

8. The method of claim 1, wherein in the first cycle and the second cycle of the step of forming the TiN unit film and the step of performing the plasma nitriding process, conditions are set to reduce the film stress.

9. A non-transitory computer-executable storage medium storing a program for controlling a film forming apparatus,
wherein the program, when executed, controls the film forming apparatus on the computer to perform a method of forming a TiN film which includes:

alternately repeating a step of forming a TiN unit film and a step of performing a plasma nitriding process on the TiN unit film to form a TiN film having a reduced film stress, wherein the step of forming the TiN unit film is performed by loading the substrate to be processed into a processing chamber, supplying $TiCl_4$ gas and a nitriding gas into the processing chamber while maintaining an inside of the processing chamber in a depressurized state, and generating a plasma from the $TiCl_4$ gas and the nitriding gas, wherein the step of performing the plasma nitriding process is performed by supplying a nitriding gas into the processing chamber and generating a plasma from the nitriding gas, wherein a film thickness of the TiN film is 10 to 40 nm, and the number of repeating the step of forming the TiN unit film and the step of performing the plasma nitriding process is in a range from 3 to 10, and wherein a film stress of the TiN film subjected to the second cycle of the step of forming the TiN unit film and the step of performing the plasma nitriding process is controlled to about zero.

* * * * *